United States Patent
Tsukada et al.

[11] Patent Number: 5,462,889
[45] Date of Patent: Oct. 31, 1995

[54] METHOD OF FABRICATING A SEMICONDUCTOR DEVICE WITH A POLYCRYSTALLINE SILICON RESISTIVE LAYER

[75] Inventors: Michiko Tsukada; Akio Matsuoka, both of Tokyo, Japan

[73] Assignee: NEC Corporation, Tokyo, Japan

[21] Appl. No.: 253,223

[22] Filed: Jun. 2, 1994

Related U.S. Application Data

[63] Continuation of Ser. No. 973,967, Nov. 9, 1992, abandoned.

[30] Foreign Application Priority Data

Nov. 8, 1991 [JP] Japan .................................. 3-292944
Nov. 8, 1991 [JP] Japan .................................. 3-292945

[51] Int. Cl.$^6$ .............................. H01L 21/70; H01L 27/00
[52] U.S. Cl. ........................... 437/60; 437/47; 437/918; 437/191
[58] Field of Search .............................. 437/918, 191, 437/60, 47; 257/389, 380, 538, 906

[56] References Cited

U.S. PATENT DOCUMENTS

| | | | |
|---|---|---|---|
| 4,256,515 | 3/1981 | Miles et al. | 437/20 |
| 4,370,798 | 2/1983 | Lien et al. | 437/60 |
| 4,406,051 | 9/1983 | Iizuka | 357/51 |
| 4,727,045 | 2/1988 | Cheung et al. | 437/47 |
| 5,013,686 | 5/1991 | Choi et al. | 437/194 |

FOREIGN PATENT DOCUMENTS 3-201555  9/1991  Japan ..................................... 437/918

Primary Examiner—Olik Chaudhuri
Assistant Examiner—H. Jey Tsai
Attorney, Agent, or Firm—Sughrue, Mion, Zinn, Macpeak & Seas

[57] ABSTRACT

Provided is a novel method of fabricating a polycrystalline silicon layer serving as a resistive element involved in a high frequency semiconductor integrated circuit device. The novel method essentially comprises following steps. A polycrystalline silicon layer is deposited on an insulation layer covering a semiconductor substrate, followed by a selective photo etching by using a photo resist as a mask, and further followed by a selective doping by using ion-implantation with employing a photo resist pattern so as to introduce dopant into the remaining polycrystalline silicon layer except for a peripheral area having a predetermined width thereby resulting in a resistive layer which comprises not only a doped area but an undped area fencing the doped area.

10 Claims, 12 Drawing Sheets

METHOD OF FABRICATING A SEMICONDUCTOR DEVICE WITH A POLYCRYSTALLINE SILICON RESISTIVE LAYER

This is a continuation of application Ser. No. 07/973,967 filed Nov. 9, 1992, abandoned.

BACKGROUND OF THE INVENTION

The invention relates to a method of fabricating a semiconductor device having a polycrystalline silicon resistive layer, and more particularly to a method of fabricating a polycrystalline silicon resistive layer having a reduced resistivity, which is involved in high frequency bipolar transistor integrated circuits.

High frequency semiconductor devices such as high frequency bipolar transistor integrated circuits includes a resistance of polycrystalline silicon, which are widely used in the prior art. The reason of those are as follows. It is, generally, desirable for such high frequency semiconductor device to reduce the parasitic capacitance. Actually, the employment of the polycrystalline silicon resistive layer in such high frequency bipolar transistor integrated circuits permits the parasitic capacitance to substantially be reduced as compared with the employment of a diffused resistor. The polycrystalline silicon resistive layer is also doped with a dopant in order to reduce the resistivity. Thus, such semiconductor devices including the doped polycrystalline silicon resistive layer are likely to suitable as high frequency devices.

In the prior art, the method of fabricating a high frequency bipolar transistor integrated circuits including the doped polycrystalline silicon resistive layer may be fabricated by following steps which are illustrated in FIGS. 1A to 1F.

With reference to FIG. 1A, a $p^-$-type silicon substrate 2 is prepared to form the high frequency bipolar transistor integrated circuits. An $n^+$-type silicon buried layer 3 is formed on the $p^-$-type silicon substrate 2, after which an n-type epitaxial layer 1 is deposited on the $n^+$-type silicon buried layer 3. Further, $p^+$-type isolation diffused layers 4 are formed in the $p^-$-type silicon substrate 2.

Subsequently, a thick silicon oxide layer 5 is formed to implement an isolation of an active region from others. An $n^+$-type collector layer 6 is formed in the n-type epitaxial layer 1. A silicon oxide film layer 8 is deposited so as to cover the active region, or the n-type epitaxial layer 1 including the $n^+$-type collector layer 6. A p-type base layer 7 is formed in the n-type epitaxial layer 1 so as to be separated from the $n^+$-type collector layer 6. After that, a silicon nitride film layer 9 is deposited so as to cover the entire surface of the device, and thus the silicon oxide film layer 8 as well as the silicon oxide thick layer 5.

With reference to FIG. 1B, the silicon nitride film 9 is formed with openings which will serve as contact holes, and thus a base contact hole, an emitter contact hole and a collector contact hole respectively. The collector contact hole exists directly over the $n^+$-type collector layer 6. A base contact layer 18 is formed in the base layer directly under the base contact hole.

With reference to FIG. 1C, a polycrystalline silicon layer 11 is deposited on the silicon nitride film layer 9 by using a deposition method such as a chemical vapor deposition. Concurrently, the polycrystalline silicon layer 11 is also deposited in the openings, or the base, emitter and collector contact holes respectively by which the polycrystalline silicon layer 11 is made into contact with the base contact layer 18 through the base contact hole, and made into contact with a part of the base layer, at which an emitter region will be formed, through the emitter contact hole, in addition made into contact with the $n^+$-type collector layer 6 through the collector contact hole. Such polycrystalline silicon layer 11 is subjected to an introduction of an n-type dopant such as arsenic or phosphorus by using an ion-implantation.

With reference to FIG. 1D, a silicon oxide film layer 20 is deposited to cover the polycrystalline silicon layer 11. A heat treatment at a temperature of 950° C. is so accomplished that a thermal diffusion permits making the n-type dopant such as arsenic or phosphorus be driven from the polycrystalline silicon layer 11 into the p-type base layer 7 in the emitter contact hole, in addition into the $n^+$-type collector layer 6. As a result of the thermal diffusion, an emitter region 15A is formed in the p-type base layer 7 directly under the emitter contact hole. Concurrently, a collector region 16A is formed in the $n^+$-type collector layer 6.

With reference to FIG. 1E, a photo resist is previously subjected to patterning by using photo etching so as to have a predetermined pattern. Subsequently, the polycrystalline silicon layer 11 is subjected to photo etching with using the photo resist pattern as a mask so that the polycrystalline silicon layer 11 remains in the vicinity of the emitter and collector contact holes, in addition on a predetermined area over the silicon oxide thick layer 5, and thus an area opposite to the active region including the base layer 7, emitter and collector regions 15A and 16A. As a result of those photo etching process, an emitter polycrystalline silicon contact 15B is formed on the emitter region 15A and a collector polycrystalline silicon contact 16A is formed on the collector region 16B. Concurrently, a polycrystalline silicon resistive layer 12 is formed on the predetermined area over the silicon oxide thick layer 5 through the silicon nitride film layer 9. The polycrystalline silicon resistive layer 12 has a predetermined dimensions, or the thickness, the width and the length so as to serve as a resistance element in which the thickness is defined by, and thus is the same as the thickness of the polycrystalline silicon layer 11.

With reference to FIG. 1F, a silicon oxide film 14 is so deposited as to cover the polycrystalline silicon resistive layer 12, after which contact holes 19 are formed in the silicon oxide film 14, which is followed by providing electrodes (not illustrated) in the contacts holes. Through the above processes, the fabrication of the high frequency bipolar transistor circuit device involving the polycrystalline silicon resistive layer is completed.

Subsequently, the fabrication process of the polycrystalline silicon resistive layer 12 will again be described in conciseness to clear the matters to be solved by the subject of the present invention directing to the method of fabricating the polycrystalline silicon resistive layer involved in the high frequency semiconductor device such as the high frequency bipolar transistor integrated circuit device.

With reference to FIG. 2A, a silicon oxide thick layer 5 is formed on a $p^-$-type silicon substrate 2. A polycrystalline silicon layer 11 is deposited on the the silicon oxide thick layer 5. Subsequently, the ion-implantation of an n-type dopant such as arsenic or phosphorus is so accomplished that the n-type dopant is doped into the entire surface of the polycrystalline silicon layer 11. After forming a silicon oxide film layer 20 covering the polycrystalline silicon resistive layer 11, a heat treatment such as annealing of the polycrystalline silicon layer 11 is required to implement an activation of the dopant.

With reference to FIG. 2B, the polycrystalline silicon layer 11 is subjected to photo etching by using the photo resist pattern which is not illustrated. The improvement of the definition of the patterned polycrystalline silicon resistive layer 12 serving as a resistance also requires the above heat treatment such as annealing.

With reference to FIG. 2C, the silicon oxide film 14 is so formed as to cover the polycrystalline silicon resistive layer 12. The silicon oxide film 14 are formed with the contact holes 19 in which contacts 20 are provided.

Such high frequency bipolar transistor integrated circuit device involving the resistance element comprising the polycrystalline silicon resistive layer 12 has been engaged with following considerable disadvantages. In view of circuit designs, the set forth polycrystalline silicon resistive layer 12 is required to have a low resistivity, typically a sheet resistance of 100 to 200 ohms/square. The sheet resistance depends upon the heat treatment for the polycrystalline silicon resistive layer 12. For instance, a heat treatment at a high temperature of 950° C. implements the dopant activation which permits providing a desirable lower sheet resistance to the polycrystalline silicon resistive layer 12. Then, the implementation of the dopant activation at a high temperature provides a reduction of the sheet resistance.

Nevertheless, the implementation of a high temperature heat treatment for a relatively long time, concurrently, serves as a prevention against the realization of the high frequency bipolar transistor. Such implementation of a high temperature heat treatment causes a thermal diffusion of the base layer 7, which makes the thickness be increased. Such diffused thick base layer is no longer able to provide a desirable high frequency characteristic to the bipolar transistor. For example, the realization of a cut-off frequency $f_T$ of 10 GHz limits a temperature of the heat treatment to 950° C. But, the realization of a cut-off frequency $f_T$ of 20 GHz limits a temperature of the heat treatment down to 900° C.

On the other hand, from the definition of the sheet resistance, it is no doubt appeared that the sheet resistance is inversely proportional to the thickness of the polycrystalline silicon resistive layer 12. Thus, the enlargement of the thickness of the polycrystalline silicon resistive layer 12 permits the sheet resistance to be reduced. FIG. 3 illustrates a variation of the sheet resistance values possessed by the polycrystalline silicon resistive layer 12 versus the dose of an ion-implantation for the thicknesses of 1500 angstroms and of 3000 angstroms in case that a heat treatment is accomplished at a temperature of 900° C. for 40 minutes. When the thickness is 1500 angstroms, the sheet resistance is 350 ohms/square. From the FIG. 3, it is understood that the thickness of 3000 angstroms provides a lower sheet resistance as compared with the thickness of 1500 angstroms.

From the above descriptions, it is required for such high frequency bipolar transistor integrated circuit device to accomplish a relatively low temperature heat treatment so as to prevent a very thin base layer to be enlarged by a thermal diffusion. It is further required to increase the thickness so as to reduce the sheet resistance of the polycrystalline silicon resistive layer 12, typically up to 3000 angstroms.

Nevertheless, the thickness of the polycrystalline silicon resistive layer 12 is defined by the thickness of the polycrystalline silicon layer 11 which has been deposited, and thus is the same as thicknesses of the polycrystalline silicon emitter contact 15B and the polycrystalline silicon collector contact 16B. As the thickness of the polycrystalline silicon resistive layer 12 is increased up to 3000 angstroms, the thicknesses of the polycrystalline silicon emitter contact 15B and of the polycrystalline silicon collector contact 16A are also forced to be increased up to 3000 angstroms. The minimization of the bipolar transistor integrated circuits renders formations of the emitter and collector contacts 15B and 16B difficult due to the large thickness of the above contacts 15A and 16A. This is also likely to cause an electrical short between the emitter and collector contacts 15A and 16A, by which the yield of the device are also lowered.

To combat those problems, it may be proposed that the polycrystalline silicon resistive layer 12 is formed prior to the formation of the emitter region 15A so as to prevent the resistive layer 12 and the emitter and collector contacts 15B and 16B to respectively be formed from the common polycrystalline silicon layer 11. This allows the polycrystalline silicon resistive layer 12 to have a larger thickness than that of the emitter and collector contacts 15B and 16B. However, in this case, the realization of a desirable and precise pattern by etching of the polycrystalline silicon resistive layer 12 requires an implementation of a heat treatment at a temperature of 900° C. for 15 minutes or more. Such implementation of the heat treatment at a high temperature for a relatively long time causes the very thin base layer 7 to be re-diffused, and thus the thickness to be increased. As a result of the re-diffusion of the base laye 7, such bipolar transistor involving the base layer 7 having an enlarged thickness which has been subjected to such undesirable heat treatment is no longer able to possess a high frequency characteristic as illustrated in FIG. 4.

Furthermore, the above heat treatment at a high temperature for a relatively long time for the accomplishment of the activation of the dopant in the polycrystalline silicon resistive layer 12 also causes the very thin base layer 7 to be re-diffused, and thus enlarged.

In addition, in view of device designs, the polycrystalline silicon resistive layer 12 is required to have a precise resistance value equal to a predetermined value. The resistance value of the polycrystalline silicon resistive layer 12 depends upon the dimensions, or the thickness, the length and the width. In view of circumstances, it is difficult for the present etching technology to prevent dimensional errors of the width and the length. Such dimensional error caused by the etching process makes bounds fencing the doped area in the polycrystalline silicon resistive layer 12 variable, since the dopant exists at an edge portion defined by etching of the polycrystalline resistive layer 12. The etching process is accomplished after the doping process. The relatively large dimensional error of the polycrystalline silicon resistive layer 12 provides a substantial large variation of the resistance value. In view of the device designs, such variation of the resistance value caused by the dimensional error is no doubt undesirable.

It is, therefore, considerable to develop a novel method of fabricating the polycrystalline silicon resistive layer having a reduced resistivity, and thus a lower sheet resistance which is suitable as a resistive element involved in the high frequency bipolar transistor integrated circuit device. It is further desirable that such novel fabrication method of the polycrystalline silicon resistive layer permits preventing the thickness of the base layer to be enlarged by the thermal diffusion which is caused by such heat treatment for accomplishment of the activation of the dopant so as to reduce the sheet resistance or for improvement of the definition, or pattern of the polycrystalline silicon resistive layer. It is also required to develop a novel fabrication method of the polycrystalline silicon resistive layer having a larger thickness than that of the emitter and collector contacts. It is additionally required to develop a novel fabrication method of the polycrystalline silicon resistive layer, which permits preventing a variation of the resistance values which is caused by the dimensional error of the width and the length generated in the photo etching process, because such variation of the resistance values is causative of affections toward circuit performances.

SUMMARY OF THE INVENTION

Accordingly, it is a primary object of the present invention to provide a novel method of fabricating a semiconductor integrated circuit device including a polycrystalline silicon resistive layer.

It is a further object of the present invention to provide a novel method of fabricating a high frequency bipolar transistor integrated circuit device including a polycrystalline silicon resistive layer.

It is a still further object of the present invention to provide a novel method of fabricating a polycrystalline silicon resistive layer which is suitable as a resistive element involved in a high frequency semiconductor integrated circuit device.

It is yet a further object of the present invention to provide a novel method of fabricating a polycrystalline silicon resistive layer which possesses a reduced resistivity and a lower sheet resistance.

It is a furthermore object of the present invention to provide a novel method of fabricating a polycrystalline silicon resistive layer which possesses higher precisions of a reduced resistivity and a lower sheet resistance.

It is another object of the present invention to provide a novel method of fabricating a polycrystalline silicon resistive layer, which allows preventing an occurrence of dimensional errors of the width and the length by etching process.

It is yet another object of the present invention to provide a novel method of fabricating a polycrystalline silicon resistive layer which has a larger thickness providing a reduced resistivity and a lower sheet resistance without rendering formations of emitter and collector contact layers difficult.

It is still another object of the present invention to provide a novel method of fabricating a polycrystalline silicon resistive layer, which permits preventing a thickness of a base layer to be enlarged by a thermal diffusion which is caused by a heat treatment for such resistive layer.

The above and other objects, features and advantages of the present invention will be apparent from following descriptions.

The present invention provides a novel method of fabricating a polycrystalline silicon layer serving as a resistive element involved in a semiconductor integrated circuit device. The novel method essentially comprises following steps.

A polycrystalline silicon layer is deposited on an insulation layer covering a semiconductor substrate by using a chemical vapor deposition. The deposited polycrystalline silicon layer is subjected to a selective etching by using a photo resist as a mask. The remaining polycrystalline silicon layer is subjected to a selective doping by using ion-implantation with employing a photo resist pattern so as to introduce dopant into the remaining polycrystalline silicon layer except for a periheral area having a predetermined width.

The ion-implantation is accomplished with employing a photo resist which covers only the undoped peripheral area of the polycrystalline silicon layer. Preferably, the undoped peripheral area has a width in the range from 0.5 to 1.5 micrometers. After the above doping process, an insulation film is so formed as to cover the doped polycrystalline silicon layer. Further, the insulation film is formed with openings in which contacts are provided. After the insulation film formation process, a heat treatment is implemented thereby causing a dopant activation which reduces a resistivity possessed by the polycrystallne silicon layer, although it is not by all means required to do so.

The resultant polycrystalline silicon layer comprises not only the doped area but the undoped peripheral area having only a predetermined width which fences the doped area.

The present invention also provides another novel method of fabricating a polycrystalline silicon layer serving as a resistive element involved in a semiconductor integrated circuit device. The novel method essentially comprises following steps.

A polycrystalline silicon layer is deposited on an insulation layer covering a semiconductor substrate by using a chemical vapor deposition. The deposited polycrystalline silicon layer is subjected to selective doping by using ion-implantation with employing a photo resist pattern as a mask. The doped polycrystalline silicon layer is subjected to a selective etching by using a photo resist pattern as a mask so as to have said polycrystalline silicon layer remain at not only said doped area but an undoped peripheral area having a predetermined width. The resultant polycrystalline silicon layer also comprises not only the doped area but the undoped area having a predetermined width which fences the doped peripheral area.

The present invention further provides a novel method of fabricating a high frequency semiconductor integrated circuit device including a polycrystalline silicon layer serving as a resistive element. The novel method essentially comprises following steps.

An active region which includes at least one active element is formed on a semiconductor substrate. An insulation layer is so formed as to implement an isolation of the active element. After that, an insulation film is formed on an entire surface of the device so as to cover both the active region and the insulation layer.

Subsequently, a polycrystalline silicon layer is deposited on the insulation film by using a chemical vapor deposition. The deposited polycrystalline silicon layer is subjected to selective etching by using a photo resist pattern as a mask so as to have the polycrystalline silicon layer remain at a predetermined area over the insulation layer opposite to the active region. The remaining polycrystalline silicon layer is subjected to selective doping by using ion-implantation with employing a photo resist pattern so as to introduce dopant into the remaining polycrystalline silicon layer except for a peripheral area having a predetermined width.

An insulation film is so formed as to cover the polycrystalline silicon layer, after which the covered polycrystalline silicon layer is subjected to a heat treatment so as to cause a dopant activation which reduces a resistivity. Such heat treatment concurrently causes a thermal diffusion which forms any active element in the active region, although it is not by all means required to do so. After forming such resultant polycrystalline silicon layer, contact electrodes of the active element, which is made of polycrystalline silicon is formed on the active region.

The present invention furthermore provides another novel method of fabricating a high frequency semiconductor integrated circuit device including a polycrystalline silicon layer serving as a resistive element. The novel method essentially comprises following steps.

An active region which includes at least one active element is formed on a semiconductor substrate. An insulation layer is so formed as to implement an isolation of the active element. After that, an insulation film is formed on an entire surface of the device so as to cover both the active region and the insulation layer.

Subsequently, a polycrystalline silicon layer is deposited on the insulation film by using a chemical vapor deposition. The deposited polycrystalline silicon layer is subjected to selective doping by using ion-implantation with employing a photo resist pattern as a mask so that dopant is introduced into a predetermined area of the polycrystalline silicon layer over the insulation layer opposite to the active region. The doped polycrystalline silicon layer is subjected to selective etching by using a photo resist pattern as a mask so as to have the polycrystalline silicon layer remain at not only the doped area but an undoped peripheral area having a predetermined width.

An insulation film is so formed as to cover the polycrystalline silicon layer, after which the covered polycrystalline silicon layer is subjected to a heat treatment so as to cause a dopant activation which reduces a resistivity. Such heat treatment concurrently causes a thermal diffusion which forms any active element in the active region, although it is not by all means required to do so. After forming such resultant polycrystalline silicon layer, contact electrodes of the active element, which is made of polycrystalline silicon is formed on the active region.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A novel method of fabricating a bipolar transistor integrated circuit device possessing a desirable high frequency characteristic, which includes a polycrystalline silicon resistive layer having a reduced resistivity and a lower sheet resistance will be described as a first embodiment of the present invention.

Figure 1A:
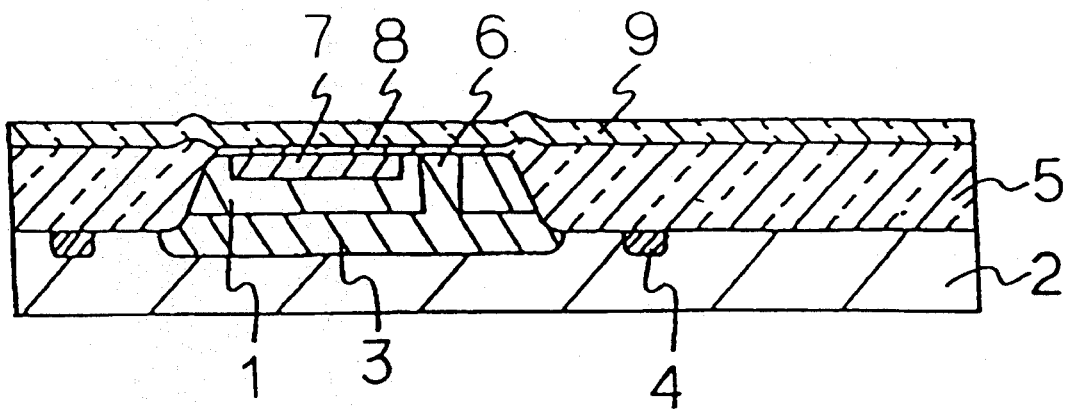
FIGS. 1A to 1F are fragmentary cross sectional elevation views illustrative of sequential processes involved in the conventional method of fabricating a bipolar transistor integrated circuit device having a polycrystalline silicon resistive layer in the prior art.
Figure 1B:
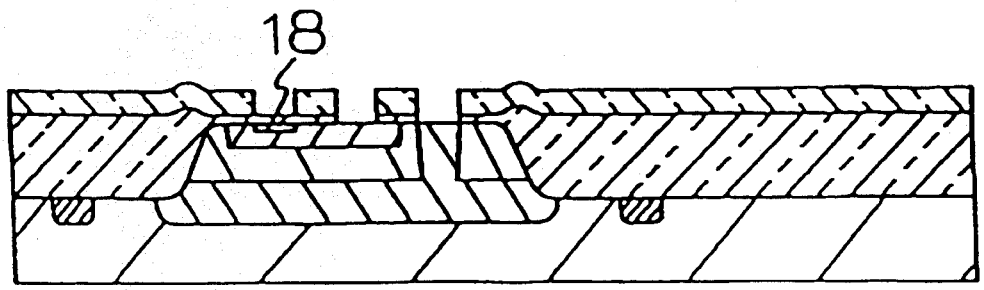
Figure 1C:
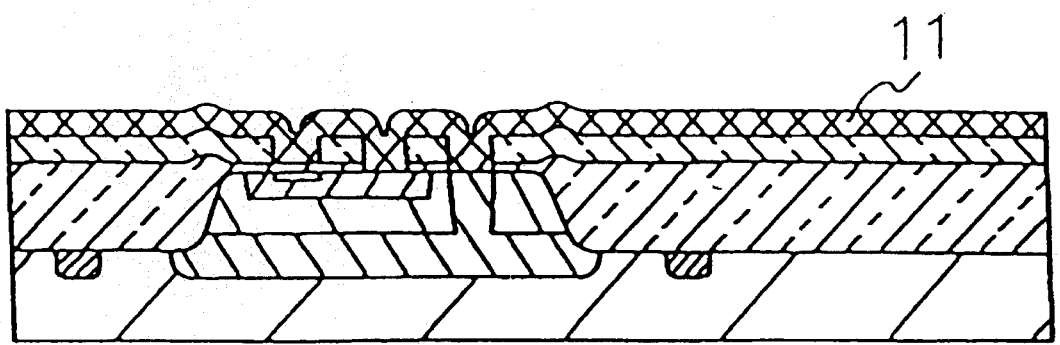
Figure 1D:
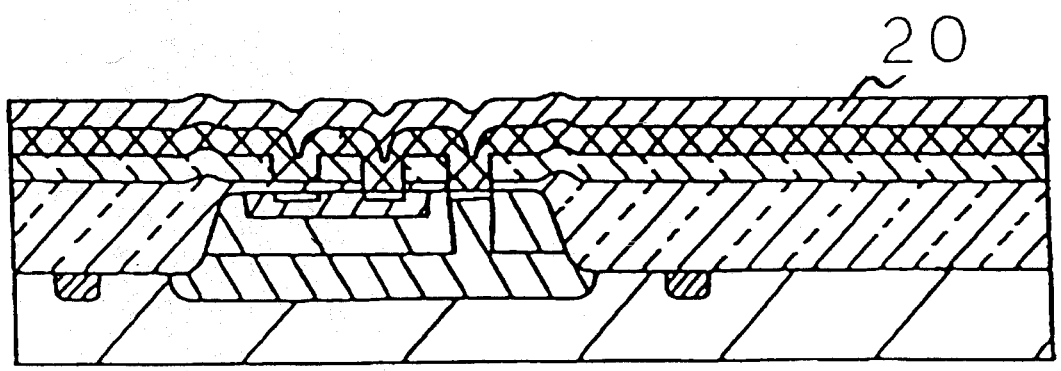
Figure 1E:
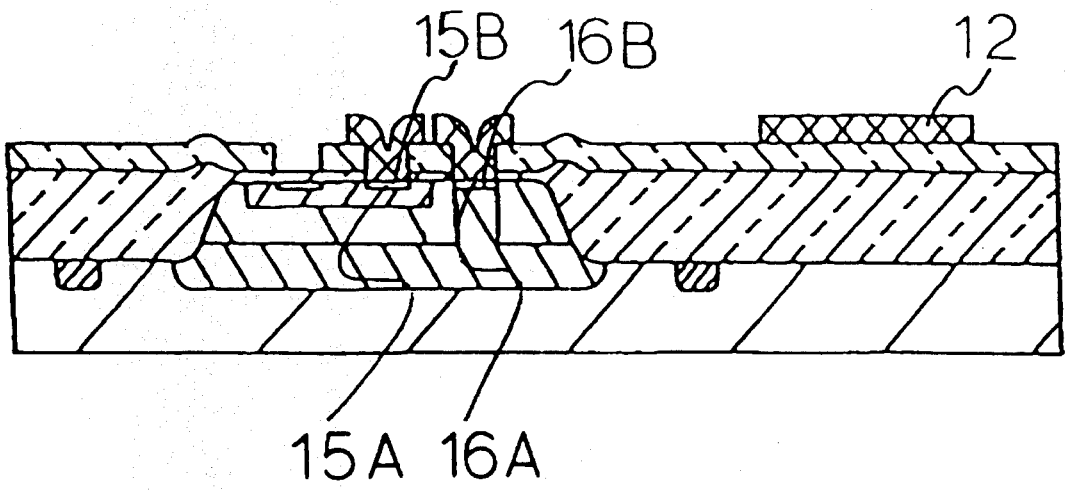
Figure 1F:
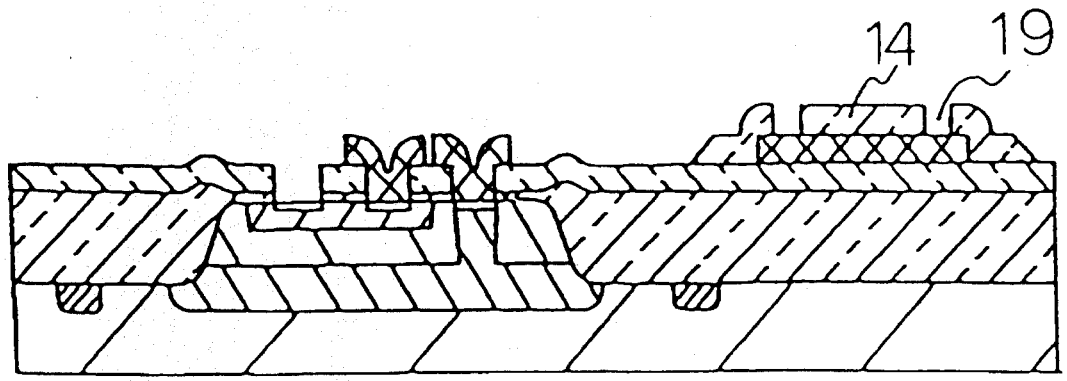
Figure 2A:
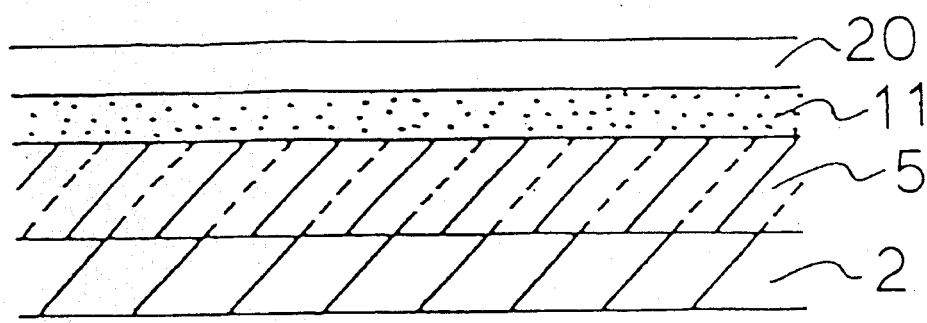
FIGS. 2A to 2C are fragmentary cross sectional elevation views illustrative of sequential processes involved in the conventional method of fabricating a polycrystalline silicon resistive layer involved in a bipolar transistor integrated circuit device in the prior art.
Figure 2B:
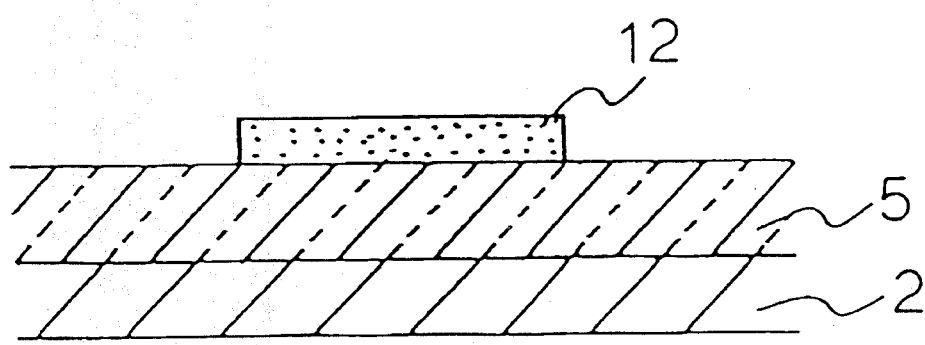
Figure 2C:
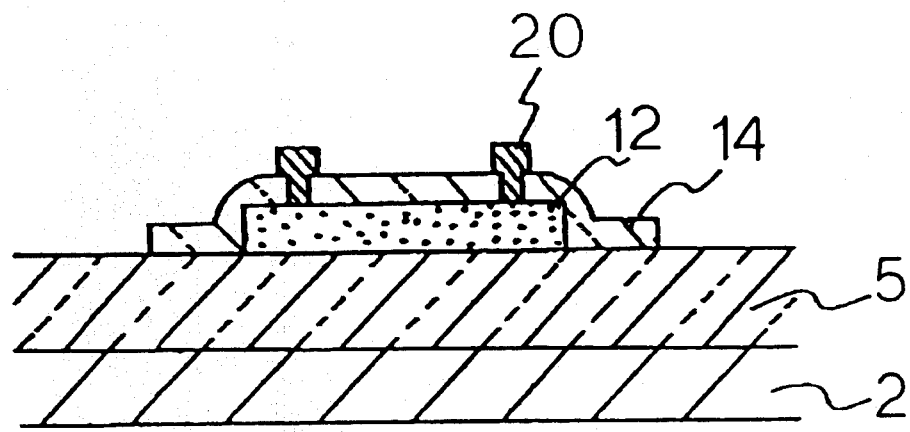
Figure 3:
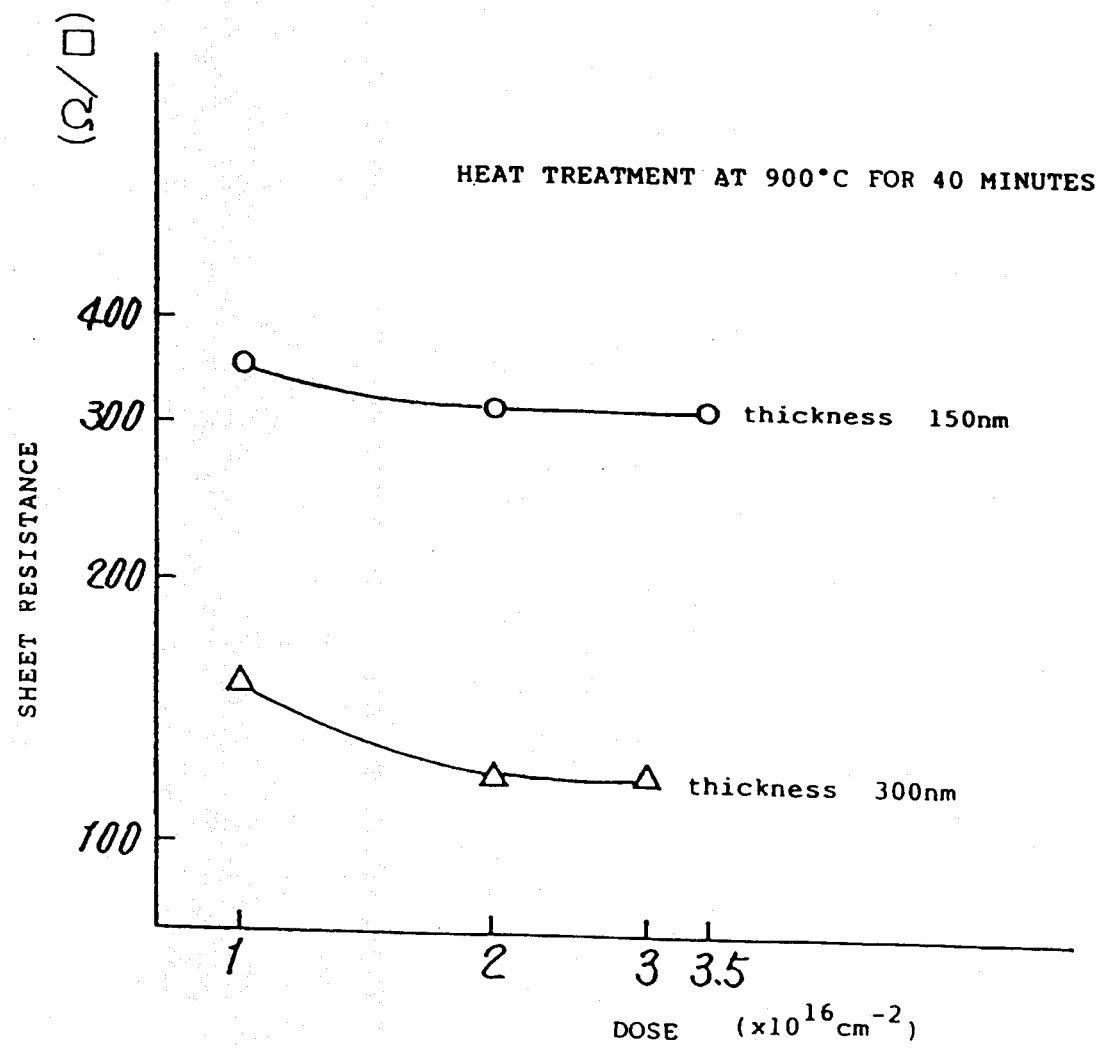
FIG. 3 is a diagram illustrative of a variation of sheet resistance values possessed by a polycrystalline silicon resistive layer versus the dose of an ion-implantation for thicknesses of 1500 angstroms and of 3000 angstroms in case of a heat treatment at a temperature of 900° C. for 40 minutes.
Figure 4:
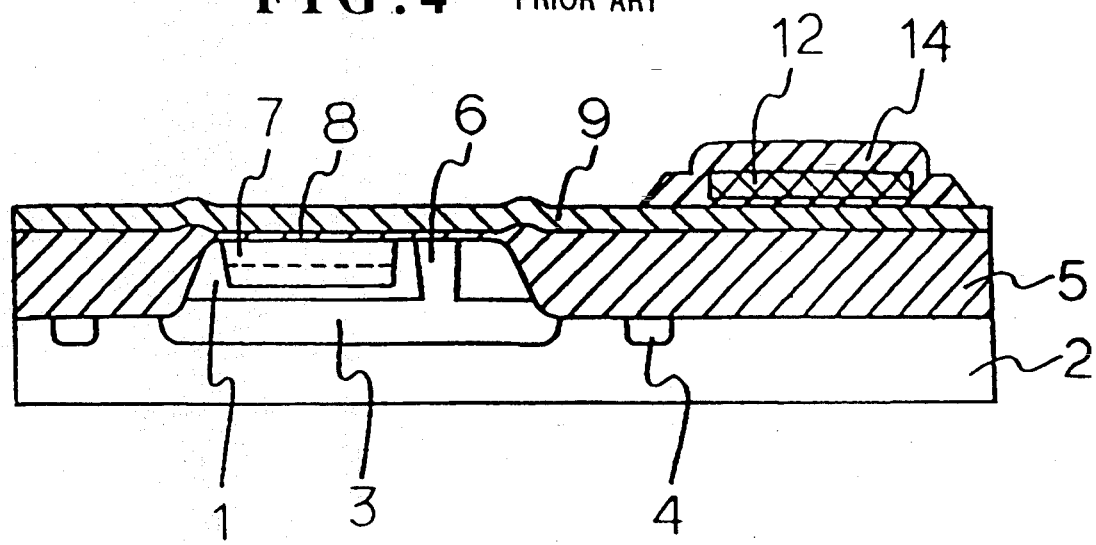
FIG. 4 is a fragmentary cross sectional elevation view illustrative of one step involved in sequential processes of another conventional method of fabricating a bipolar transistor integrated circuit device having a polycrystalline silicon resistive layer in the prior art.
Figure 5A:
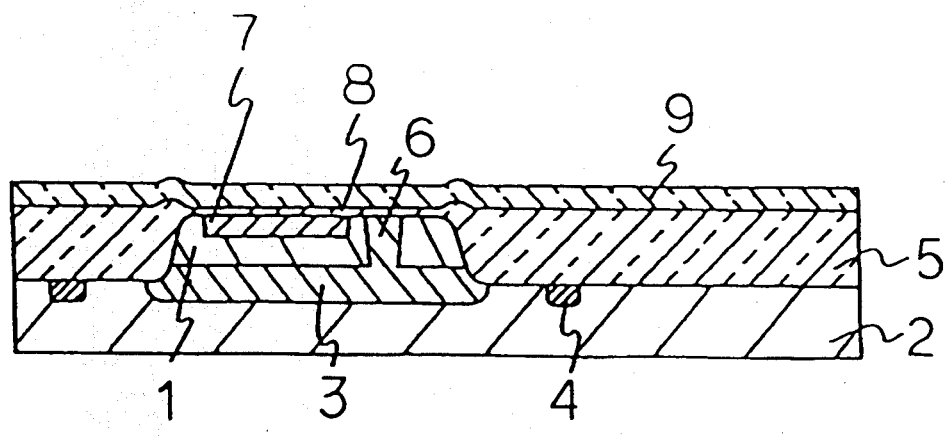
FIGS. 5A to 5F are fragmentary cross sectional elevation views illustrative of sequential processes involved in a novel method of fabricating a bipolar transistor integrated circuit device having a polycrystalline silicon resistive layer in a first embodiment according to the present invention.

With reference to FIG. 5A, a $p^-$-type silicon substrate 2 is prepared to form a bipolar transistor integrated circuit device. An $n^+$-type silicon buried layer 3 is formed on the $p^-$-type silicon substrate 2, after which an n-type epitaxial layer 1 is deposited on the $n^+$-type silicon buried layer 3. Further, $p^+$-type isolation diffused layers 4 are formed in the $p^-$-type silicon substrate 2.

Subsequently, a thick silicon oxide layer 5 is formed to accomplish an isolation of an active region, in which a bipolar transistor will be formed, from others. An $n^+$-type collector layer 6 is formed in the n-type epitaxial layer 1. A silicon oxide film layer 8 is so deposited as to cover the active region including the n-type epitaxial layer 1, the $n^+$-type collector layer 6. A p-type base layer 7 is formed in the n-type epitaxial layer 1 so that the p-type base layer 7 is separated from the $n^+$-type collector layer 6. After that, a silicon nitride film layer 9 is so deposited as to cover the entire surface of the device, and thus the silicon oxide film 8 as well as the silicon oxide thick layer 5.

Figure 5B:
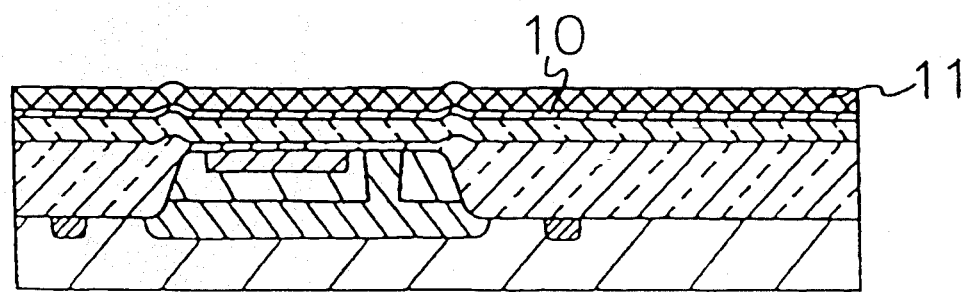

With reference to FIG. 5B, a silicon oxide film layer 10 having a thickness in the range from 500 angstroms to 1000 angstroms is deposited on the entire surface of the silicon nitride film layer 9 by using a deposition method such as a chemical vapor deposition. After that, a polycrystalline silicon layer 11 having a thickness of approximately 3000 angstroms is also deposited on the silicon oxide film layer 10 by using a deposition method such as a chemical vapor deposition.

Figure 5C:
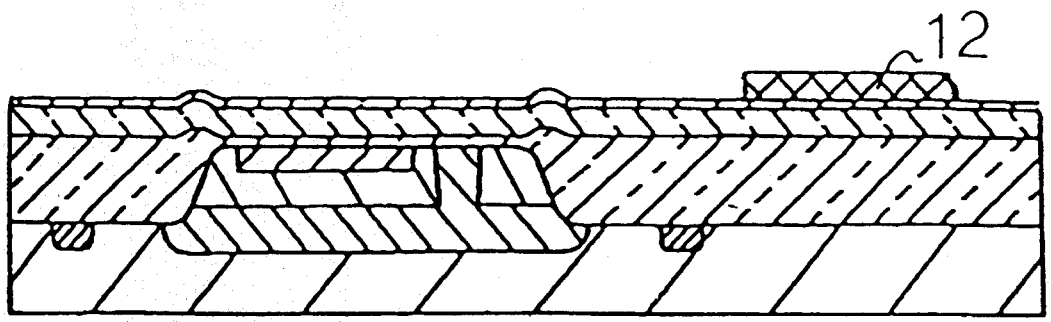

With reference to FIG. 5C, a photo resist which is not illustrated is previously prepared and subjected to patterning by using photo etching so as to have a predetermined desirable pattern. Subsequently, the polycrystalline silicon layer 11 is subjected to plasma etching of a gas such as a chlorine gas by using the above photo resist pattern as a mask. As a result of the accomplishment of the plasma etching, the polycrystalline silicon layer 11 remains only at a predetermined area over the silicon oxide thick layer 5 which isolates the active region including the p-type base layer 7 and the n$^+$-type collector layer 6. The remaining portion of the polycrystalline silicon layer 11 will serve as a resistance, and thus a polycrystalline silicon resistive layer 12 is formed.

Figure 5D:
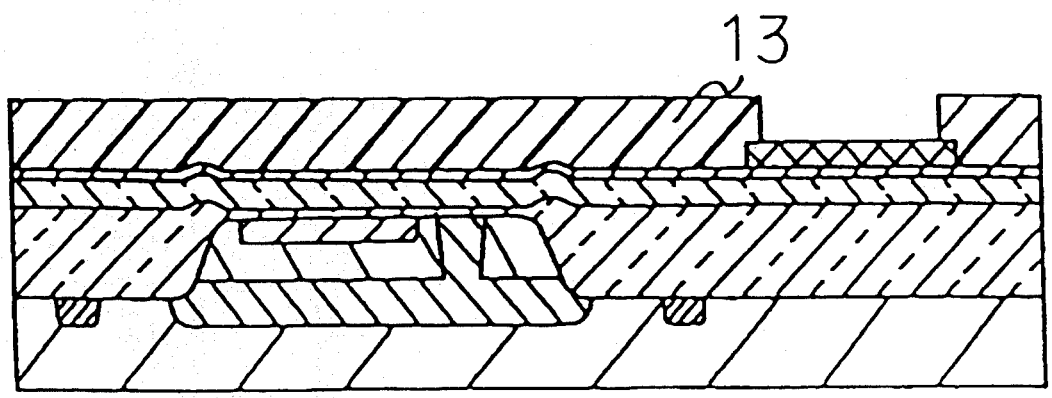

With reference to FIG. 5D, a photo resist 13 is applied on the entire surface of the device, by which the polycrystalline silicon resistive layer 12 is also covered with the photo resist 13. After that, the photo resist 13 is formed by using photo etching with an opening directly over the polycrystalline silicon resistive layer 12. It is considerable that the opening is so formed that the photo resist 13 covers a peripheral area of the polycrystalline silicon resistive layer 12. An ion-implantation of n-type dopant such as arsenic or phosphorus is carried out with employing the photo resist having such opening as a mask thereby resulting in an introduction of the dopant into the polycrystalline silicon resistive layer 12. The peripheral area of the polycrystalline silicon resistive layer 12 is subjected to no doping due to the existence of the covering photo resist 13.

Figure 5E:
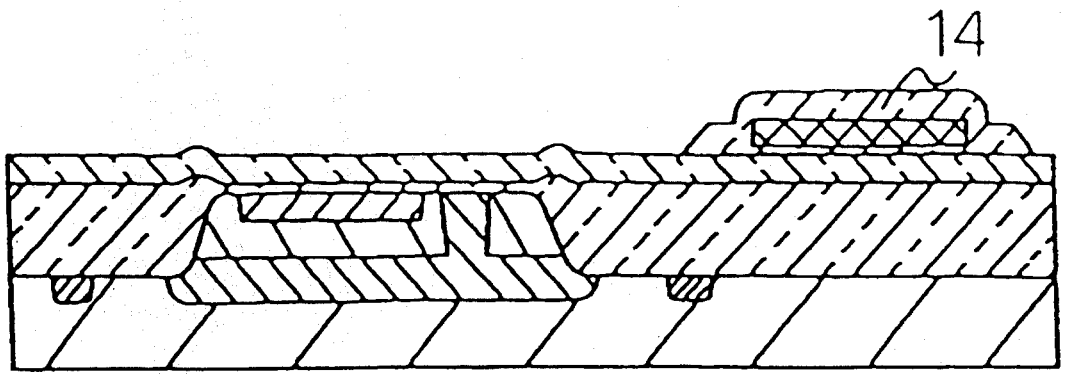

With reference to FIG. 5E, the photo resist 13 is completely removed from the surface of the silicon oxide film layer 10, after which a silicon oxide film 14 is formed on the entire surface of the silicon oxide film layer 10 by using a chemical vapor deposition. The photo etching is so accomplished that the deposited silicon oxide film 14, in addition the silicon oxide film layer 10 are selectively removed except in the vicinity of the polycrystalline silicon resistive layer 12. Thus, the deposited silicon oxide film 14 as well as the silicon oxide film layer 10 remain only in the vicinity of the polycrystalline silicon resistive layer 12 so as to surround and isolate the polycrystalline silicon resistive layer 12.

Figure 5F:
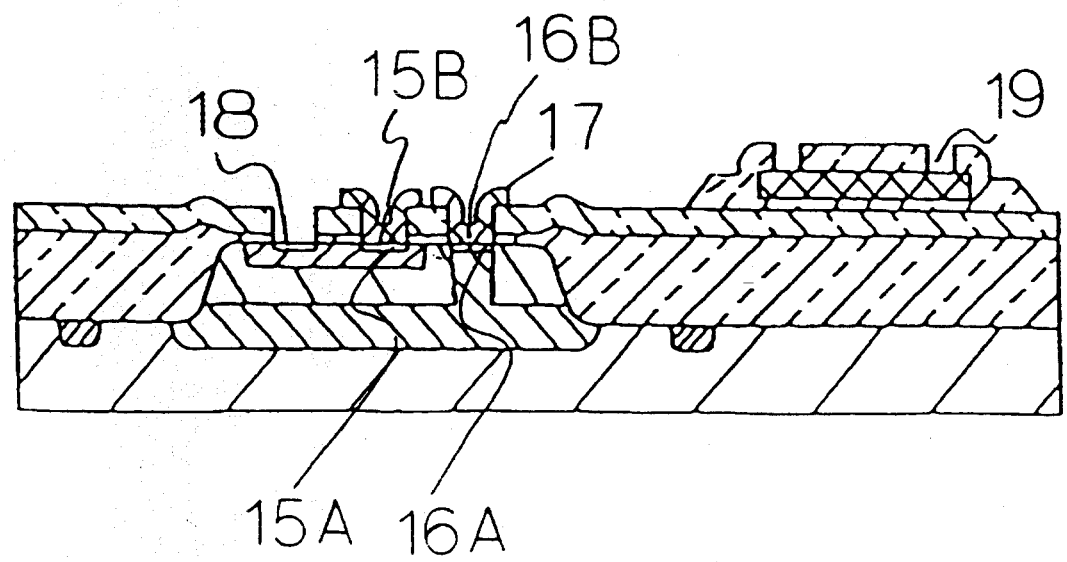

With reference to FIG. 5F, the silicon nitride film layer 9 is formed with three openings at predetermined portions so that two of the openings exist over the p-type base layer 7 and another exists directly over the n$^{30}$-type collector layer 6. And thus, the three openings will serve as base, emitter and collector contact holes respectively. After that, a polycrystalline silicon layer 17 is deposited on the silicon nitride film layer 9 by using a deposition method such as a chemical vapor deposition. Since the silicon nitride film layer 9 has the three openings, the polycrystalline silicon layer 17 is also deposited in the openings. As a result of those, the polycrystalline silicon layer 17 is made into contact with the p-type base layer 7 through the base and emitter contact holes, in addition with the n$^+$-type collector layer 6 through the collector contact hole.

The polycrystalline silicon layer 17 is subjected to doping with an n-type dopant such as arsenic by using an ion-implantation. A heat treatment is accomplished at a temperature of 900° C. for times in the range from 10 minutes to 60 minutes thereby causing thermal diffusion, by which the n-type dopant such as arsenic is driven from the polycrystalline silicon layer 17 into the p-type base layer 7 through the emitter contact hole as well as into the n$^+$-type collector layer 6 through the collector contact hole. As a result of the thermal diffusion, an emitter region 15A is formed in the p-type base layer 7 directly under the emitter contact hole. Concurrently, a collector region 16A is formed in the n-type collector layer 6. In addition, a thermal diffusion of p-type dopant, or boron is so accomplished that a base contact layer 18 is formed in the base layer 7.

A photo resist which is not illustrated is previously prepared and subjected to patterning by using photo etching so as to have a predetermined desirable pattern. Subsequently, the polycrystalline silicon layer 17 is subjected to photo etching with employing the photo resist pattern as a mask so that the polycrystalline silicon layer 17 is selectively removed, except in the vicinity of the both emitter and collector contact holes. Namely, the polycrystalline silicon layer 17 remains only in the vicinity of both the emitter and collector contact holes. As a result of those, the remaining portions of the polycrystalline silicon layer 17 serve as an emitter contact 15B and a collector contact 16B respectively.

The polycrystalline silicon layer 17 may have a predetermined thickness which is smaller than the thickness of the polycrystalline silicon resistive layer 12. Thus, the thicknesses of the emitter contact 15B and the collector contact 16B are smaller than the thickness of the polycrystalline silicon resistive layer 12 thereby being free from the difficulty in the formation of the emitter and collector contacts 15B and 16B caused by the minimization of the device.

The silicon oxide film 14 is formed with openings which serve as contact holes 19. The contact holes 19 are respectively provided therein with contacts which are not illustrated. Through the above processes, the fabrication of the high frequency bipolar transistor integrated circuit device involving an improved polycrystalline silicon resistive layer is completed.

Such novel fabrication method of this embodiment provides following advantages to the high frequency bipolar transistor integrated circuit device. The polycrystalline silicon resistive layer 12 has precise dimensions in the width and the length, in addition such resistive layer 12 has side walls which are precisely vertical to the surface of the silicon oxide film layer 10 as well as the surface of which has a uniformity. The novel fabrication method of this embodiment of the polycrystalline silicon resistive layer 12 permits the dimensional errors of the width and the thickness to substantially be reduced as compared with the prior art. The reason of those are as follows.

In the prior art, the etching process for the polycrystalline silicon resistive layer 12 follows the ion-implantation process. Thus, the polycrystalline silicon resistive layer 12 which has been doped with dopant is subjected to etching thereby resulting in an occurrence of a relatively large dimensional errors of the width and the length.

In contrast to the prior art, the novel fabrication method of this embodiment implements etching process prior to the implementation of the ion-implantation whereby resulting in the introduction of the dopant into the polycrystalline silicon resistive layer 12 except for the peripheral area. In accordance with this embodiment, since the undoped polycrystalline silicon resistive layer 12 is subjected to etching, or the plasma etching, the polycrystalline silicon resistive layer 12 has desirable and precise dimensions of the width and the length. Therefore, the implementation of the etching process prior to the doping process enables the dimensional errors of the width and the thickness to substantially be reduced as compared with the prior art. The prevention of the occurrence of the dimensional errors of the width and the length may provide a desirable and precise resistance value to the polycrystalline silicon resistive layer 12.

In addition to the above, it is also considerable that the novel fabrication method according to this embodiment may be free from a heat treatment which is implemented for realization of the desirable and precise patterning of the polycrystalline silicon resistive layer 12, although the prior art has requested to do so. Namely, the polycrystalline silicon resistive layer 12 which is fabricated by the novel fabrication method of this embodiment has a sufficient desirable definition without undesirable heat treatments required by the prior art. Therefore, the novel fabrication method of this embodiment permits preventing the thickness of the p-type base layer 7 to be enlarged by a thermal diffusion which is caused by such heat treatment. This provides a desirable high frequency characteristic to the bipolar transistor integrated circuit device.

Furthermore, the polycrystalline silicon resistive layer 12 is fabricated in the different step to the fabrication steps of the emitter and collector contacts 15B and 16B, and thus the emitter and collector contacts 15B and 16B are formed from the different layer to the polycrystalline silicon layer 11, from which the resistive layer 12 is formed. As a result of those, the polycrystalline silicon resistive layer 12 may readily be so designed that the thickness is larger than that of the emitter and collector contacts 15B and 16B. The enlargement of the thickness of the polycrystalline silicon resistive layer 12 permits the sheet resistance to substantially be reduced. This provides a desirable high frequency characteristic to the bipolar transistor integrated circuit device.

The subject of the present invention is manifested in the fabrication processes of the polycrystalline silicon resistive layer 12. A novel method of fabricating a polycrystalline silicon resistive layer involved in a semiconductor device will now be described as a second embodiment.

Figure 6A:
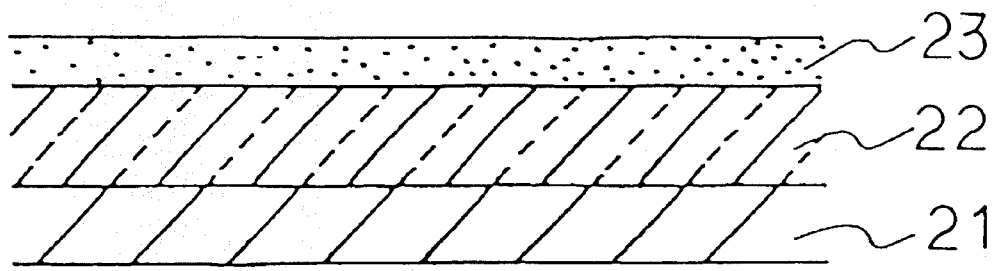
FIGS. 6A to 6C are fragmentary cross sectional elevation views illustrative of sequential processes involved in a novel method of fabricating a polycrystalline silicon resistive layer involved in a high frequency bipolar transistor integrated circuit device in a second embodiment according to the present invention.

With reference to FIG. 6A, a semiconductor substrate 21 is prepared, after which an insulation film 22 such as silicon oxide film is formed on the semiconductor substrate 21. A polycrystalline silicon layer 23 is deposited on the insulation film 22 up to a thickness in the range from 1000 angstroms to 3000 angstroms.

Figure 6B:
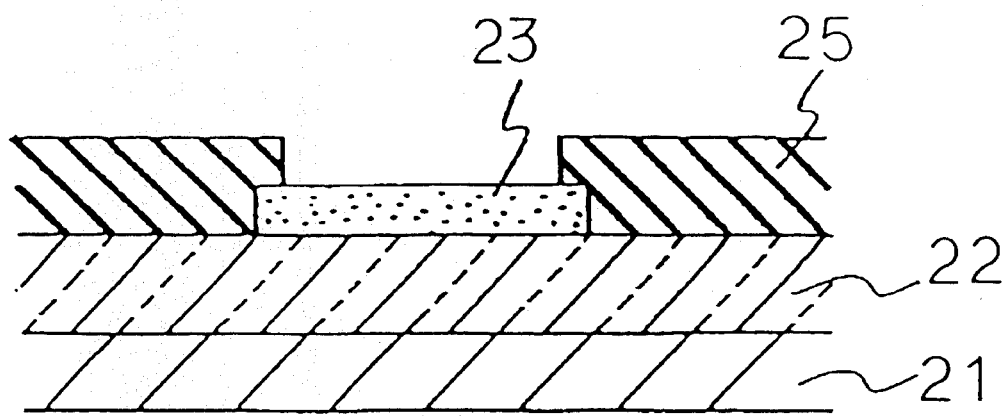

With reference to FIG. 6B, a photo resist which is not illustrated is applied on the entire surface of the device so as to cover the polycrystalline silicon layer 23. The photo resist is subjected to etching so that an opening is formed in the photo resist. The polycrystalline silicon layer 23 is subjected to photo etching by using the photo resist having the opening as a mask. As a result of the photo etching, the polycrystalline silicon layer 23 is selectively removed, and thus remains at a predetermined area on the insulation film 22. The remaining polycrystalline silicon layer 23 will serve as a resistive layer involved in a semiconductor device such as a high frequency bipolar transistor integrated circuit device.

Subsequently, a photo resist 25 is applied on the entire surface of the device so as to cover the insulation film 22 as well as the remaining polycrystalline silicon layer 23. The applied photo resist 25 is formed with an opening so that the opening exists directly over the remaining polycrystalline silicon layer 23.

Figure 7:
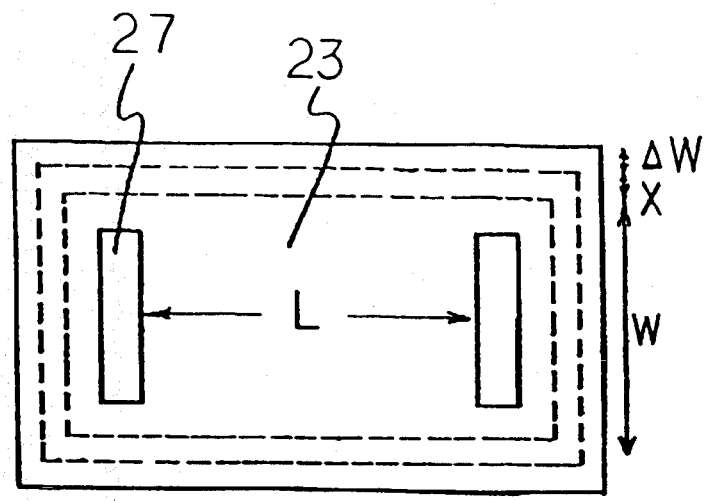
FIG. 7 is a plane view illustrative of a boundary line which fences a doping area to be doped by using an ion-implantation into a polycrystalline silicon resistive layer of the second embodiment according to the present invention.

FIG. 7 illustrates the surface of the polycrystalline silicon layer 23 having boundary lines which fence off the exposed area from the covered area by the photo resist 25. It is considerable that a peripheral area of the polycrystalline silicon layer 23 is covered with the photo resist 25. Then, the polycrystalline silicon layer 23 is exposed except for the peripheral area having a predetermined width.

Figure 8:
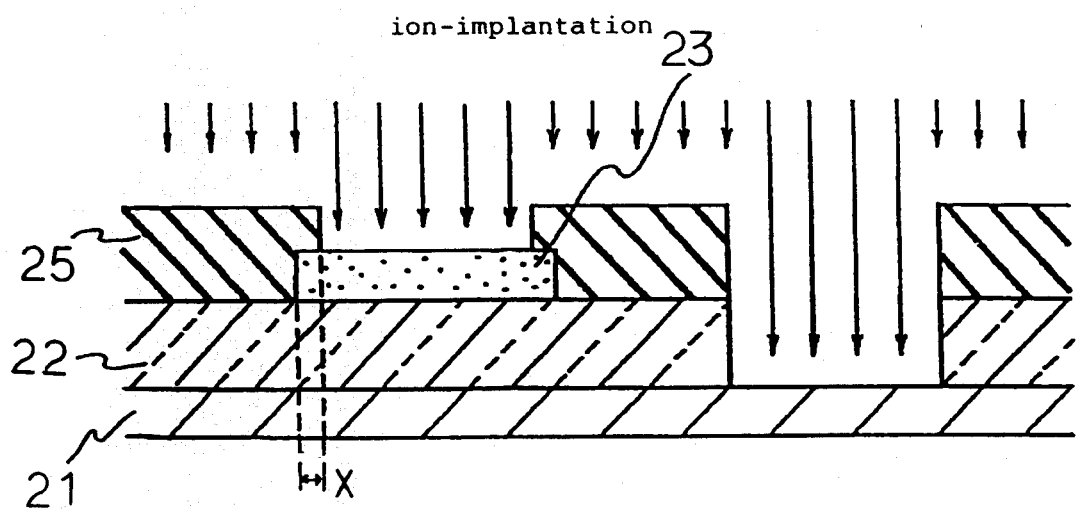
FIG. 8 is a fragmentary cross sectional elevation view illustrative of an ion-implantation process for a polycrystalline silicon resistive layer involved in sequential processes of a novel method of fabricating a semiconductor device of the second embodiment according to the present invention.

With reference to FIG. 8, an ion-implantation of the n-type dopant such as arsenic is carried out by using the photo resist 25 having the opening as a mask. The polycrystalline silicon layer 23 except for the peripheral area covered with the photo resist 25 is subjected to doping of the n-type dopant on condition of a predetermined dose, so that the polycrystalline silicon layer 23 has a sheet resistance of approximately 200 ohms/square. Preferably, the photo resist may be formed with other openings except for the above opening in order to prevent a charge-up of ions in the photo resist 25 caused by the ion-implantation, although it is not by all means required to do so.

With reference back to FIG. 7, the ion-implantation employing the photo resist 25 as a mask introduces the n-type dopant such as arsenic into only a predetermined area having a width of "W", which is enclosed by an inner boundary dot line, and thus the polycrystalline silicon layer 23 has the undoped peripheral area having a width of "X" and the doped area having the width of "W" which is fenced by the undoped peripheral area. As a result of those, the doped area in the polycrystalline silicon layer 23 is invariable, even if dimensional errors in the width and the length of the polycrystalline silicon layer 23 are occurred by a variation of the etching. This permits rendering a sheet resistance of the polycrystalline silicon layer 23 remain at a predetermined and desirable value.

The distance "X" which is the width of the undoped peripheral area should be determined with considering following factors. First factor is a variation of the dimensions, and thus dimensional errors of the polycrystalline silicon layer 23 caused by etching. Second factor is the accuracy of alignment of the mask member comprising the photo resist. Third factor is the thermal diffusion of the dopant in the horizontal direction, which provides the dopant activation. Preferably, the distance "X" should be so determined as to be in the range from 0.5 micrometers to 1.5 micrometers. The results of the measurement of variation of the resistance are shows in following table in which "W" and "L" are respectively the width and the length of the polycrystalline silicon layer 23 serving as the resistive layer, in addition the "X" is the width of the undoped peripheral area fencing the doped area of the polycrystalline silicon layer 23.

TABLE 1

| W × L (μm) | VARIATION OF RESISTANCE (%) | | | |
| --- | --- | --- | --- | --- |
| | PRIOR ART | INVENTION | | |
| | | $X = 0.5$ (μm) | $X = 1.0$ (μm) | $X = 0.5$ (μm) |
| 10 × 10 | 7.2 | | 2.2 | |
| 40 × 40 | 3.8 | | 1.3 | |
| 80 × 80 | 6.6 | | 1.3 | |
| 40 × 10 | 3.5 | | 1.9 | |
| 10 × 20 | | 2.0 | 3.8 | 2.0 |
| 20 × 20 | | 2.1 | 2.1 | 1.7 |

From the above table 1, it is no doubt understood following matters. In the prior art, the resultant polycrystalline silicon layer 23 has a relatively large variation of the resistance value, typically 7.2% or 6.6 %. In contrast to the prior art, the novel fabrication method of the present invention permits the resultant polycrystalline silicon layer 23 to have a substantially reduced variation of the resistance values, for example, in the range from 1.3% to 3.8%.

The existence of the undoped prepheral area having the width of "X" permits preventing the above undesirable factors to vary dimensions of the doped area in the polycrystalline silicon layer 23.

In addition, it is desirable that the contacts 27 exist at a predetermined distance "L" so that the both are provided within the doped area of the polycrystalline silicon layer 23.

Figure 6C:
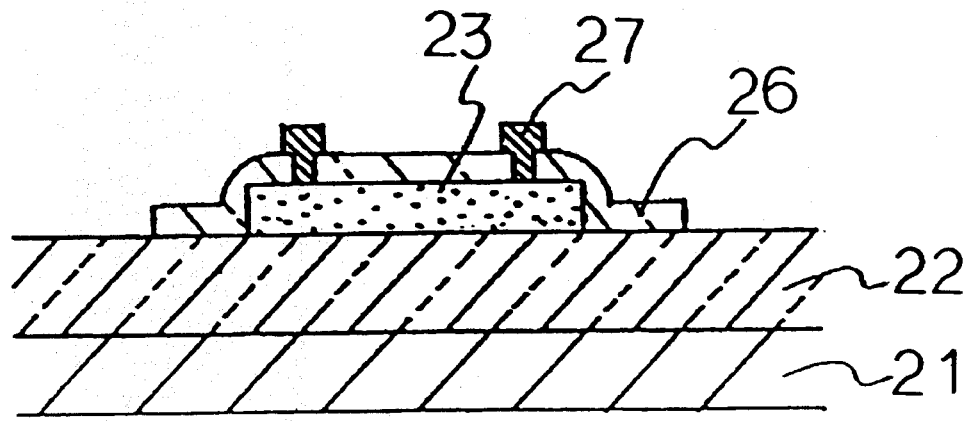

With reference back to FIG. 6C, subsequently, an insulation film 26 such as a silicon oxide film is so formed as to cover the polycrystalline silicon layer 23. The insulation film 26 is formed with openings which serve as contact holes in which contacts 27 are provided.

Further, a heat treatment such as annealing is accomplished at a temperature in the range from 900° C. to 1000° C. thereby resulting in an implementation of dopant activation. Such annealing for the dopant activation may be implemented in any processes, except for processes before the formation of the insulation film 26. Such dopant activation caused by the annealing also permits rendering the sheet resistance of the polycrystalline silicon layer 23 be effectively reduced. Preferably, such annealing for the dopant activation and other heart treatment are concurrently carried out so that the sole annealing process causes not only the dopant activation in the polycrystalline silicon layer 23 but a thermal diffusion. In case of a bipolar transistor integrated circuit device, such sole annealing for the dopant activation of the polycrystalline silicon layer 23 enables making a thermal diffusion of the dopant form an emitter region. This permits rendering any affections such as an undesirable thermal re-diffusion of the base layer caused by a thermal diffusion invalid.

Another novel method of fabricating a polycrystalline silicon resistive layer involved in a semiconductor device will subsequently be described as a third embodiment.

Figure 9:
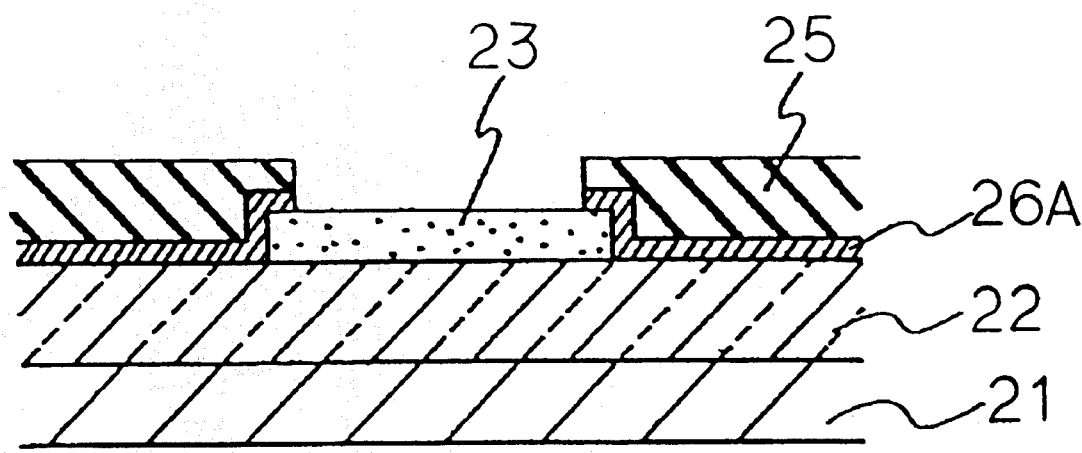
FIG. 9 is a fragmentary cross sectional elevation view illustrative of one process involved in sequential processes of a novel method of fabricating a polycrystalline silicon resistive layer which is provided in a semiconductor device in a third embodiment according to the present invention.

With reference to FIG. 9, a semiconductor substrate 21 is prepared, after which an insulation film 22 such as silicon oxide film is formed on the semiconductor substrate 21. A polycrystalline silicon layer 23 is deposited on the insulation film 22.

A photo resist which is not illustrated is applied on the entire surface of the device so as to cover the polycrystalline silicon layer 23. The photo resist is subjected to etching so that an opening is formed in the photo resist. The polycrystalline silicon layer 23 is subjected to photo etching by using the photo resist having the opening as a mask. As a result of the photo etching, the polycrystalline silicon layer 23 is selectively removed, and thus remains at a predetermined area on the insulation film 22. The remaining polycrystalline silicon layer 23 will serve as a resistive layer involved in a semiconductor device such as a high frequency bipolar transistor integrated circuit device.

Subsequently, a metal layer 26A made of a conductive metal such as titanium or aluminium is formed on the entire surface of the device by using a vacuum evaporation method or the like so as to the cover the insulation film 22 as well as the resultant polycrystalline silicon layer 23. A photo resist 25 is applied on the metal layer 26A. The applied photo resist 25 and the metal layer 26A are formed with an opening so that the opening exists directly over the remaining polycrystalline silicon layer 23. The polycrystalline silicon layer 23 has a peripheral area having a predetermined width which is covered with the photo resist 25 through the metal layer 26A.

An ion-implantation of an n-type dopant such as arsenic is carried out by employing such photo resist 25 having the opening as a mask. As a result of the ion-implanatation, the n-type dopant is introduced into the polycrystalline silicon layer 23, except for the peripheral area covered with the photo resist 25. Thus, the resultant polycrystalline silicon layer 23 comprises the doped area which is exposed and the undoped peripheral area which is covered with the photo resist 25. The edge of the opening formed in the photo resist 25 fences off the doped area from the undoped peripheral area.

For this embodiment, it is considerable that the existence of the metal layer 26A underlying the photo resist 25 allows securely preventing a charge-up of ions caused by the ion-implantation. It is also available that the prevention of the charge-up of ions is realized by using a combination of the existence of the metal layer 26A with a formation of such openings illustrated in FIG. 8 in the photo resist 25, except for the opening directly over the polycrystalline silicon layer 23, although it is unnecessary to do so.

Needless to say, the resultant polycrystalline silicon layer 23 has the undoped peripheral area, the doped area in the polycrystalline silicon layer 23 is free from the dimensional errors of the width and the length which is caused by various and undesirable factors involved in the etching process and the ion-implantation process. Such factors are as follows. First is a variation of the dimensions, and thus dimensional errors of the polycrystalline silicon layer 23 caused by etching. Second is the accuracy of alignment of the mask member comprising the photo resist. Third is the thermal diffusion of the dopant in the horizontal direction for the dopant activation. Therefore, the existence of the undoped peripheral area fencing the doped area permits the resistance of the polycrystalline silicon layer 23 to remain at a predetermined value.

Another novel method of fabricating a polycrystalline silicon resistive layer involved in a semiconductor device will subsequently be described as a fourth embodiment.

Figure 10:
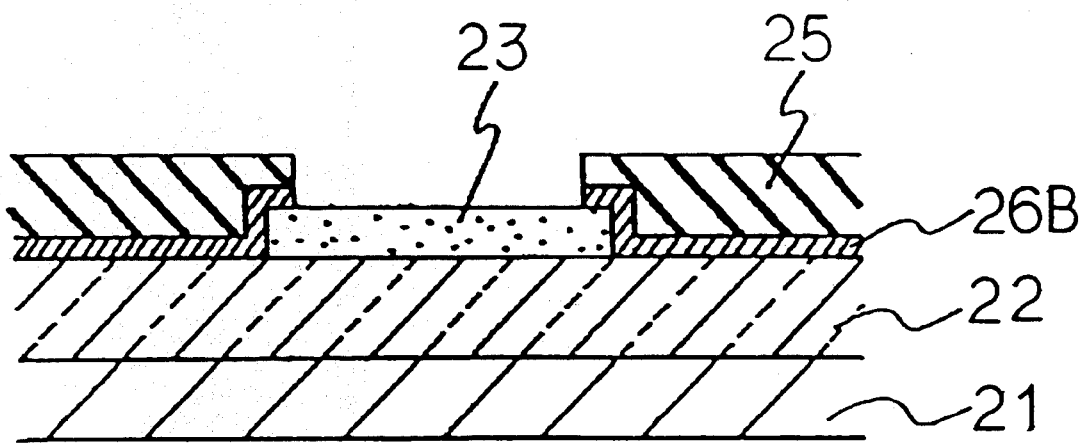
FIG. 10 is a fragmentary cross sectional elevation view illustrative of one process involved in sequential processes of a novel method of fabricating a polycrystalline silicon resistive layer which is provided in a semiconductor device in a fourth embodiment according to the present invention.

With reference to FIG. 10, a semiconductor substrate 21 is prepared, after which an insulation film 22 such as silicon oxide film is formed on the semiconductor substrate 21. A polycrystalline silicon layer 23 is deposited on the insulation film 22.

A photo resist which is not illustrated is applied on the entire surface of the device so as to cover the polycrystalline silicon layer 23. The photo resist is subjected to etching so that an opening is formed in the photo resist. The polycrystalline silicon layer 23 is subjected to photo etching by using the photo resist having the opening as a mask. As a result of the photo etching, the polycrystalline silicon layer 23 is selectively removed, and thus remains at a predetermined area on the insulation film 22. The remaining polycrystalline silicon layer 23 will serve as a resistive layer involved in a semiconductor device such as a high frequency bipolar transistor integrated circuit device.

Subsequently, an insulation layer 26B such a silicon oxide layer is formed on the entire surface of the device by using a chemical vapor deposition or the like so as to cover the insulation film 22 as well as the resultant polycrystalline silicon layer 23. A photo resist 25 is applied on the insulation layer 26B. The applied photo resist 25 and the insulation layer 26B are formed with an opening so that the opening exists directly over the remaining polycrystalline silicon layer 23. The polycrystalline silicon layer 23 has a peripheral area having a predetermined width which is covered with the photo resist 25 through the insulation layer 26B.

A high energy ion-implantation of an n-type dopant such as arsenic is carried out by employing such photo resist 25 having the opening as a mask. If the energy of the ion-implantation is high, for example, approximately several hundreds KeV, such high energy ions may pass through the photo resist 25. In such case, the existence of the insulation layer 26B allows preventing such high energy ions which passed through the photo resist 25 to be introduced into the insulation film 22. This permits securely preventing a charge-up of ions. As a result of the ion-implantation, the n-type dopant is introduced into the polycrystalline silicon layer 23, except for the peripheral area covered with the photo resist 25. Thus, the resultant polycrystalline silicon layer 23 comprises the doped area which is exposed and the undoped peripheral area which is covered with the photo resist 25. The edge of the opening formed in the photo resist 25 fences off the doped area from the undoped peripheral area.

For this embodiment, it is considerable that the existence of the insulation layer 26B underlying the photo resist 25 allows securely preventing a charge-up of ions caused by the high energy ion-implantation. It is also available that the prevention of the charge-up of ions is realized by using a combination of the existence of the insulation layer 26B with a formation of such openings illustrated in FIG. 8 in the photo resist 25, except for the opening directly over the polycystalline silicon layer 23, although it is unnecessary to do so.

Needless to say, the resultant polycrystalline silicon layer 23 has the undoped peripheral area, the doped area in the polycrystalline silicon layer 23 is free from the dimensional errors of the width and the length which is caused by various undesirable factors involved in the etching process and the ion-implantation process. Therefore, the existence of the undoped peripheral area fencing the doped area permits the resistance of the polycrystalline silicon layer 23 to remain at a predetermined value.

Another novel method of fabricating a polycrystalline silicon resistive layer involved in a semiconductor device will subsequently be described as a fifth embodiment.

Figure 11A:
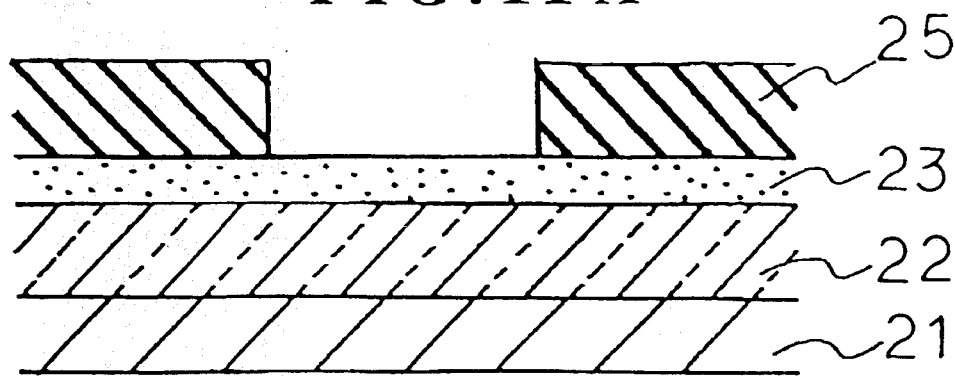
FIGS. 11A to 11C are fragmentary cross sectional elevation views illustrative of sequential processes involved in a novel method of fabricating a polycrystalline silicon resistive layer which is provided in a semiconductor device in a fifth embodiment according to the present invention.
Figure 11B:
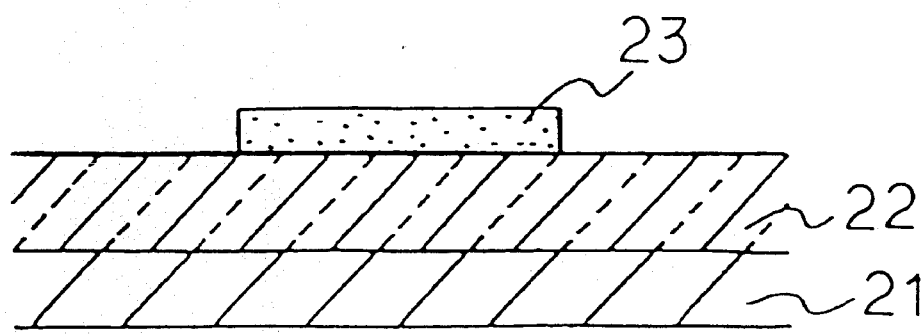

With reference to FIG. 11A, a semiconductor substrate 21 is prepared, after which an insulation film 22 such as silicon oxide film is formed on the semiconductor substrate 21. A polycrystalline silicon layer 23 is deposited on the insulation film 22.

Subsequently, a photo resist 25 is applied on the entire surface of the device so as to cover the polycrystalline silicon layer 23. The photo resist 25 is subjected to etching so that an opening is formed in the photo resist 25. An ion-implantation of the n-type dopant such as arsenic is carried out by using the photo resist 25 having the opening as a mask. The polycrystalline silicon layer 23 except for the area covered with the photo resist 25 is subjected to doping of the n-type dopant on condition of a predetermined dose. Preferably, the photo resist may be formed with other openings except for the above opening in order to prevent a charge-up of ions in the photo resist 25 caused by the ion-implantation, although it is not by all means required to do so. As a result of the ion-implantation, the dopant is introduced into a predetermined area defined by the photo resist pattern 25 at a predetermined dose. After the ion-implantation, the photo resist 25 is completely removed.

A photo resist which is not illustrated is applied on the entire surface of the polycrystalline silicon layer 23 so as to cover the doped area and the undoped area opposite to the doped area. The photo resist is subjected to patterning so that the photo resist remains over not only a doped area but an undoped peripheral area having a predetermined width fencing the doped area. The polycrystalline silicon layer 23 is subjected to photo etching by using the photo resist having the opening as a mask. As a result of the photo etching, the polycrystalline silicon layer 23 is selectively removed so as to have the doped area and the undoped peripheral area of the polycrystalline silicon layer 23 remain. The remaining polycrystalline silicon layer 23 will serve as a resistive layer involved in a semiconductor device such as a high frequency bipolar transistor integrated circuit device.

Then, the resultant polycrystalline silicon layer 23 serving as the resistive layer comprises not only the doped area but the undoped peripheral area fencing the doped area. This results in a permission to make the doped area in the polycrystalline silicon layer 23 invariable, even if dimensional errors in the width and the length of the polycrystalline silicon layer 23 are occurred by a variation of the etching. This permits rendering a sheet resistance of the polycrystalline silicon layer 23 serving as the resistive layer remain at a predetermined and desirable value.

The distance which is the width of the undoped peripheral area should be determined with considering following factors. First factor is a variation of the dimensions, and thus dimensional errors of the polycrystalline silicon layer 23 caused by etching. Second factor is the accuracy of alignment of the mask member comprising the photo resist. Third factor is the thermal diffusion of the dopant in the horizontal direction, which provides the dopant activation. The existence of the undoped perpheral area permits preventing the above undesirable factors to vary dimensions of the doped area in the polycrystalline silicon layer 23.

Figure 11C:
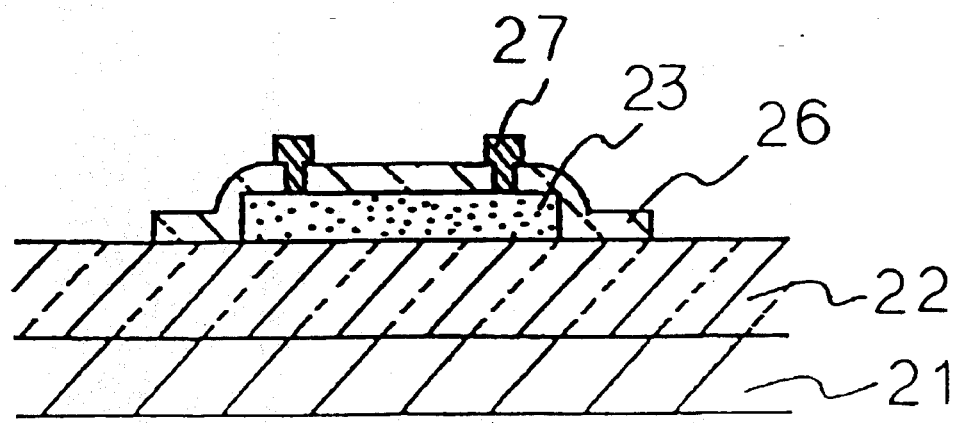

With reference to FIG. 11C, subsequently, an insulation film 26 such as a silicon oxide film is so formed as to cover the polucrystalline silicon layer 23. The insulation film 26 is formed with openings which serve as contact holes in which contacts 27 are provided.

Further, a heat treatment such as annealing is accomplished at a predetermined temperature thereby resulting in an implementation of dopant activation. Such annealing for the dopant activation may be implemented in any processes after forming the insulation film 26. Such dopant activation caused by the annealing also permits rendering the sheet resistance of the polycrystalline silicon layer 23 be effectively reduced. Preferably, such annealing for the dopant activation and other heart treatment may concurrently be carried out so that the sole annealing process causes not only the dopant activation in the polycrystalline silicon layer 23 but a thermal diffusion.

In case of a bipolar transistor integrated circuit device, such sole annealing providing the dopant activation to the polycrystalline silicon layer 23 enables causing a thermal diffusion of the dopant to form an emitter region. This permits rendering any affections such as an undesirable thermal re-diffusion of the base layer invalid thereby securing a high frequency characteristic of the bipolar transistor.

Although those embodiments have said that an improved polycrystalline silicon resistive layer fabricated by the novel method provided by the present invention is suitable as a resistive element involved in the bipolar transistor integrated circuit device, such polycrystalline silicon resistive layer permits serving as a resistive element involved in other types of semiconductor devices.

Needless to say, the materials and dimensions of the each element as well as the above conditions, at which the above processes are accomplished, and thus the temperatures, dose, times and others are variable by matching various requirements.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A method of fabricating a polycrystalline silicon layer serving as a resistive element involved in a semiconductor integrated circuit device, said method comprising the steps of:

depositing a polycrystalline silicon layer on an insulation layer covering a semiconductor substrate;

subjecting said deposited polycrystalline silicon layer to selective doping by using ion-implantation with employing a photo resist pattern; and subjecting said doped polycrystalline silicon layer to a selective etching by using a photo resist pattern as a mask so as to have said polycrystalline silicon layer remain at not only said doped area but an undoped peripheral area having a width of 0.5 to 1.5 micrometers, wherein said peripheral area acts as a buffer preventing variation of area, caused by variations in said selective etching, from occurring in a central portion of said polycrystalline silicon layer.

2. The method of fabricating a polycrystalline silicon layer serving as a resistive element as claimed in claim 1, wherein said etching is accomplished by using a photo resist which covers not only said doped area but an undoped peripheral area of said polycrystalline silicon layer.

3. The method of fabricating a polycrystalline silicon layer serving as a resistive element as claimed in claim 1, further comprising the steps of:

forming an insulation film so as to cover said doped polycrystalline silicon layer; and subjecting said covered polycrystalline silicon layer to a heat treatment for dopant activation.

4. The method of fabricating a polycrystalline silicon layer serving as a resistive element as claimed in claim 1, wherein said ion-implantation is accomplished with employing both a photo resist and a conductive metal layer underlying said photo resist, said conductive metal layer serving as a prevention against a charge-up of ions.

5. The method of fabricating a polycrystalline silicon layer serving as a resistive element as claimed in claim 1, wherein said ion-implantation is accomplished with employing both a photo resist and an insulation film underlying said photo resist, said insulation film serving as a prevention against a charge-up of high energy ions.

6. A method of fabricating a high frequency semiconductor integrated circuit device including a polycrystalline silicon layer serving as a resistive element, said method comprising the steps of:

forming an active region including at least one active element on a semiconductor substrate;

forming an insulation layer so as to accomplish the isolation of said active element;

forming an insulation film on an entire surface of said device so as to cover both said active region and said insulation layer;

depositing a polycrystalline silicon layer on said insulation film;

subjecting said deposited polycrystalline silicon layer to selective doping by using ion-implantation with employing a photo resist pattern as a mask so that dopant is introduced into a predetermined area over said insulation layer opposite to said active region; and subjecting said doped polycrystalline silicon layer to a selective etching by using a photo resist pattern as a mask so as to have said polycrystalline silicon layer remain at not only said doped area but an undoped peripheral area having a width of 0.5 to 1.5 micrometers, wherein said peripheral area acts as a buffer preventing variation of area, caused by variations in said selective etching, from occurring in a central portion of said polycrystalline silicon layer.

7. The method of fabricating a polycrystalline silicon layer serving as a resistive element as claimed in claim 6, wherein said ion-implantation is accomplished with employing a photo resist which covers only said undoped peripheral area of said remaining polycrystalline silicon layer.

8. The method of fabricating a polycrystalline silicon layer serving as a resistive element as claimed in claim 6, further comprising the steps of:

forming an insulation film so as to cover said doped polycrystalline silicon layer; and subjecting said covered polycrystalline silicon layer to a heat treatment for dopant activation.

9. The method of fabricating a polycrystalline silicon layer serving as a resistive element as claimed in claim 8, wherein said heat treatment is accomplished so as to cause not only said dopant activation but a thermal diffusion for forming active elements.

10. The method of fabricating a polycrystalline silicon layer serving as a resistive element as claimed in claim 6, further comprising the steps of:

forming contact electrodes of said active element, which comprises polycrystalline silicon after forming said polycrystalline silicon layer serving as a resistive element.

* * * * *